United States Patent
Blees et al.

(10) Patent No.: US 6,739,255 B2
(45) Date of Patent: May 25, 2004

(54) STAMP, METHOD, AND APPARATUS

(75) Inventors: Martin Hillebrand Blees, Eindhoven (NL); Peter Jan Slikkerveer, Eindhoven (NL); Sigrid Maria Roman Gelderland, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/990,435

(22) Filed: Nov. 21, 2001

(65) Prior Publication Data

US 2002/0073861 A1 Jun. 20, 2002

(30) Foreign Application Priority Data

Nov. 22, 2000 (EP) .............................. 00204123

(51) Int. Cl.$^7$ ................................. B41K 1/38
(52) U.S. Cl. ................ 101/327; 101/103; 101/109
(58) Field of Search ............... 101/103, 109, 101/112, 327, 333, 405

(56) References Cited

U.S. PATENT DOCUMENTS

| | | | |
|---|---|---|---|
| 2,543,045 A | * 2/1951 | Murray | 427/561 |
| 3,277,819 A | * 10/1966 | Berkland | 101/125 |
| 3,678,848 A | * 7/1972 | Roser et al. | 101/125 |
| 3,971,315 A | * 7/1976 | Hansen | 101/333 |
| 5,048,415 A | * 9/1991 | Shih | 101/103 |
| 5,669,303 A | * 9/1997 | Maracas et al. | 101/327 |
| 5,817,242 A | * 10/1998 | Biebuyck et al. | 216/41 |
| 5,899,142 A | * 5/1999 | Suda et al. | 101/125 |
| 5,996,493 A | * 12/1999 | Okumura et al. | 101/333 |
| 6,047,639 A | * 4/2000 | Shih | 101/333 |
| 6,180,239 B1 | * 1/2001 | Whitesides et al. | 428/411.1 |

FOREIGN PATENT DOCUMENTS

| | | | |
|---|---|---|---|
| CH | 002215410 | 1/1999 | |
| JP | 07214883 A | 8/1995 | ............ B41K/1/50 |

OTHER PUBLICATIONS

"Contact–Inking for Microcontact Printing of Alkanethiols on Gold" by Laurent Libioulle, Alexander Bietsch, Heinz Schmid, Bruno Michel, and Emmanuel Delamarche in Langmuir 1998, 15, 300–304.

Soft Lithography by Younan Xia and George M. Whitesides, in Angew. Chem. Int. Ed., 1998, 37, pp. 550–575.

\* cited by examiner

Primary Examiner—Charles H. Nolan, Jr.
Assistant Examiner—Jill E. Culler
(74) Attorney, Agent, or Firm—Peter Zawilski

(57) ABSTRACT

The stamp (10) for use in a lithographic process, such as patterning a surface layer, of the invention has a stamp body (1) with a first (11) and a second side (12), at which first side (11) a printing face (2) is present and at which second side (12) a stack of a carrier body (4) and a reservoir (3) for liquid are present. The carrier body contains channels (5) in order that the liquid can be transported from the reservoir (3) to the stamp body (1) and further to the printing face (2). The stamp may be embodied as a cylinder, allowing a continuous lithographic printing process. This process results in patterns on a micron or submicron scale. The stamp (10) may furthermore be included in a larger apparatus.

9 Claims, 3 Drawing Sheets

STAMP, METHOD, AND APPARATUS

The invention relates to a stamp for use in a lithographic process, which stamp comprises a stamp body with a first and a second, opposed side, with a structured printing face at the first side and a reservoir for a liquid at the second side, which stamp body is permeable to the liquid.

The invention also relates to a method of manufacturing an electronic component, which method comprises the patterning of a surface of a substrate by means of a stamp, which stamp is provided with a structured printing face for use in a lithographic process and which stamp is brought into contact with the substrate such that a compound present at the printing face is transferred to the surface of the substrate.

The invention furthermore relates to an apparatus for providing at least one patterned layer on a substrate.

Such a stamp and such a method are known from *Langmuir*, 15 (1999), 300–304, by Libioulle et al. Patterns can be provided in or on a substrate by means of the known stamp without the necessity of bringing the printing face into contact with a separate, external reservoir of liquid each time, which liquid will also be referred to as ink hereinafter. The term "liquid" is also understood to relate to a solution and to a finely distributed dispersion. The liquid may be very viscous. A compound present as a liquid is then transferred from the printing face to the surface of the substrate. The known stamp has a stamp material of polydimethyl siloxane, which will be denoted PDMS hereinafter. A solution of an alkane thiole in ethanol is present in the reservoir as the ink. The stamp body and the reservoir are clamped in a glass cylinder with a diameter of 5 mm. The printing face is present at one end of the cylinder. The other end is sealed by fusion. In the method, a patterned monolayer of thiole was provided on a gold substrate.

A disadvantage of the known stamp is that the layer provided with the stamp comprised patterns which were deformed, as was noted already in the cited publication.

It is a first object of the invention to provide a stamp of the kind mentioned in the opening paragraph with which deformation is suppressed during its use for the application of a patterned layer.

It is a second object of the invention to provide a method of the kind mentioned in the second paragraph wherein the printing face need not be brought into contact with an external ink reservoir and wherein the patterned layer does not comprise patterns which are deformed.

It is a third object of the invention to provide an apparatus of the kind mentioned in the third paragraph which comprises the stamp according to the invention.

The first object is achieved in that a carrier body is present between the stamp body and the reservoir, which carrier body is permeable to the liquid present in the reservoir, and liquid is transported from the reservoir to the printing face during use.

It was found that, if the stamp is not clamped in an impermeable cylinder of rigid material, the deformation of patterns in the resulting layer is absent. Swelling of the stamp body was mentioned as the cause of the deformation in the cited publication. In the stamp according to the invention, the stamp body is not clamped in, but fastened on a carrier body. If any swelling should take place owing to the presence of ink, it will take place in direction which is substantially perpendicular to the first and the second side of the stamp body. All lateral dimensions will remain substantially constant during this, so that the pattern of the printing face can be correctly transferred to the substrate. Neither does any bending of the stamp body take place, because the stamp body is supported at its second side.

An advantage of the stamp according to the invention is that the carrier body may at the same time be used as a substrate in the manufacture of the stamp. The stamp body may be provided on the carrier body by pouring, injecting, or some other simple technique. The stamp body is preferably manufactured from an elastic material. Such a material preferably has a Young's modulus of between $10^3$ and $10^6$, in particular between $0.25 \times 10^5$ and $5 \times 10^5$ N/m$^2$. Examples of such materials are inter alia poly(dimethylsiloxane), which material is also known as PDMS, poly(butadiene), poly(acrylamide), poly(butylstyrene), poly(urethane) and copolymers of these materials. Any other material known to those skilled in the art of soft lithography may obviously also be used in the stamp body.

A choice may be made from a variety of materials for the manufacture of the carrier body. Examples of suitable materials are a metal, such as aluminum or steel, a ceramic material, and an organic material such as a synthetic resin, which may or may not be reinforced with organic or inorganic fibers. Preferably, the carrier body has a much higher rigidity constant than the material of the stamp body. The carrier body may be integral with the ink reservoir.

In a favorable embodiment, the carrier body has a first and a second, opposed side, with the stamp body at the first side and the reservoir at the second side, the carrier body comprises channels, and at least a portion of the channels extends from the first to the second side of the carrier body. The channels in the carrier body may be provided in various ways. A first example is through perforation of the carrier body. A second example is through patterning of the carrier body, whereby a pattern of channels is created in the carrier body. Preferably, the channels fully traverse the carrier body in a few locations only. Patterning of the carrier body may take place in various ways: examples are dry or wet etching, powder blasting, and laser cutting. Patterning may also take place from two mutually opposed sides of the carrier body. With such a two-sided treatment, the channels at the one side may have a much greater diameter than those at the other side. It is also possible for the number of channels at the one side to be much larger per unit surface area than at the other side. Further methods of patterning are known to those skilled in the art.

Another advantage of the stamp according to the invention is that the adhesion between the carrier body and the stamp body is good. Owing to the contribution of the insides of the channels, the available surface area for adhesion to the carrier body is larger than for a comparable carrier body without channels. Also, both bodies may be anchored mechanically.

In a specific embodiment, a distributor body is present between the carrier body and the stamp body. Such a distributor body is preferably of a rubbery nature and has the function of achieving that the ink will be present at the second side of the stamp body in a concentration which is substantially the same everywhere at the second side, viewed substantially parallel to the printing face. Such a distributor body is especially favorable if the distance between the first and the second side of the stamp body is small.

In another specific embodiment, the first and the second side of the stamp body lie at a distance from one another, and the channels at the first side of the carrier body each have a diameter which is smaller than said distance between the first and the second side of the stamp body. The feed rate of the ink through the carrier body in this embodiment is substantially defined by the capacity of the channels. Preferably, the—average—diameter of the channels is smaller at the first side of the carrier body than at the second side of the carrier body, in as far as the channels fully traverse the carrier body. The channels in this case are substantially conical in shape, with the apex of the cone at the first side of the carrier body.

In another embodiment, the carrier body comprises a porous material. The porous material is, for example, a ceramic material or a synthetic resin. Such porous materials are known to those skilled in the art of inorganic or organic materials. Preferably, the porous material has a porosity of more than 40% in relation to the volume of the reservoir, the material is inert in the ink, and the material does not swell in the ink.

In a further embodiment, the reservoir comprises a porous material. The porous material is, for example, a ceramic material or a synthetic resin. The porous material may be a foam or a sponge, and it may furthermore comprise cavities which are in communication with one another. Such porous materials are known to those skilled in the art of inorganic or organic materials. Preferably, the porous material has a porosity of more than 70% in relation to the volume of the reservoir, the material is inert in the ink, and the material does not swell in the ink.

A first advantage of the embodiment is that the reservoir is a body which provides the stamp with an additional sturdiness. A second advantage of the embodiment is that no or substantially no displacement of the ink in the reservoir takes place upon a rotation of the stamp. A third advantage of the embodiment is that a supply line can be connected to the body, through which line the ink used up during operation of the stamp can be topped up and/or refreshed.

The stamp may be constructed, for example, with a planar printing face or with a printing face which is curved in the form of a circular segment. The circular segment preferably covers an angle of approximately 30°. It is particularly favorable, however, if the carrier body and the stamp body are each curved so as to form the shell of a cylinder. In this embodiment, the stamp is cylindrical in shape, with the printing face as the outermost cylinder shell. The stamp may accordingly be used as a roller. Large surface areas of a substrate can be provided with a patterned layer by means of a roller. The fact that the printing face of the stamp according to the invention need not be brought into contact with an external ink reservoir offers advantages in the use of the stamp as a roller. A first advantage is that the ink is present at the printing face in a much more constant concentration. A second advantage is that the printing face is less subject to wear. In conventional methods utilizing cylindrical stamps, the ink is preferably provided on the printing face by means of an inking roller.

The second object of the invention, i.e. to provide a method of manufacturing an electronic component of the kind mentioned in the second paragraph, is achieved in that the stamp of the present invention is used.

The ink used is, for example, a solution of $C_{10}$–$C_{20}$ alkane thioles in ethanol. A wide variety of inorganic, organic, and polymeric materials and solutions thereof may be used as the liquid. Examples are acids and bases solutions of resist materials, trichlorosiloxanes, and phosphates, but also solutions of functional materials such as semiconducting organic materials. Further examples of materials and soft lithography methods are known from G. M. Whitesides and Y. Xia, *Angew. Chem. Int. Ed.* 37(1998), 500–575. The pattern of the layer patterned by the method according to the invention may comprise details which vary from the submicron scale up to more than 100 microns. In particular, the pattern comprises details in a range from approximately 1 to 10 microns.

The compound provided by means of the stamp may form a layer on the substrate with a layer thickness of a few nanometers. Such a layer may have a specific function or may serve as a base layer on which layers can be deposited by other methods known in semiconductor technology, such as electroplating.

Alternatively, the compound provided on the substrate by the stamp may take part in a reaction taking place at the surface of the substrate. The term "reaction" here relates to chemical reactions, etching or dissolving reactions, and surface modifications owing to physical processes such as diffusion. The compound may be present at the printing face in this case, or alternatively in the cavities.

The term "electronic component" here covers semiconductor devices, displays, lamps, passive components, networks of passive components, printed circuit boards, but also plates which are optically, magnetically, or electronically readable, such as smart cards and optical discs.

In a favorable embodiment, the stamp is cylindrical in shape, and the stamp is rotated when being applied to the substrate such that the entire printing face of the stamp is rolled over the substrate. The pattern of the printing face can be provided on a surface of any, preferably large size in an uninterrupted process in this embodiment. Such a process is a comparatively inexpensive and flexible process whereby small structures can be provided on or in a substrate in a non-photolithographic manner.

The third object is realized in that the stamp according to the invention is incorporated in the apparatus according to the invention. Preferably, the apparatus according to the invention is further provided with a storage container for the solution, a pump, and a closed circuit of liquid supply lines in which the storage container, the reservoir of the stamp, and the pump are included. This has the advantage that the composition of the liquid in the reservoir can be controlled. If the liquid is a solution of an active substance, the concentration of the active substance at the surface is preferably kept as constant as possible.

These and other aspects of the stamp, the method, and the apparatus according to the invention will be explained in more detail below with reference to Figures. In different Figures, the same reference numerals relate to equivalent components as much as possible. In the Figures.

Figure 1:
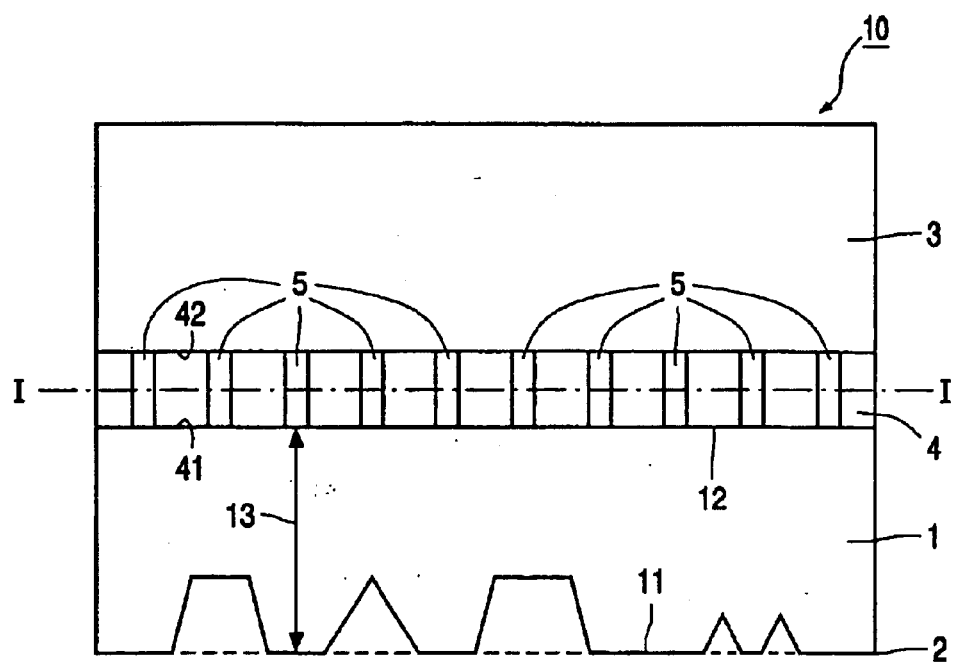
FIG. 1 is a diagrammatic side elevation of a first embodiment of the stamp.

The stamp 10 shown in FIG. 1 has a stamp body 1 which is provided with a first and with a second, opposed side 11, 12, with a structured printing face 2 at the first side 11 and a carrier body 4 provided with channels 5 at the second side 12. The carrier body 4 is present between the stamp body 1 and a reservoir 3 for ink. The ink is for example a liquid comprising a solvent and a compound to be transferred. During operation, the stamp 10 is brought with its printing face 2 into contact with a substrate such that the compound present at the printing face 2 is transferred to the substrate. The ink diffuses or flows from the reservoir 3 through the channels 5 in the carrier body 4 and the stamp body 1 to the printing face 2. If the ink is a solution, the solvent may flow faster than the compound and can evaporate from the printing face. The carrier body 4 has a first side 41 and a second, opposed side 42, with the stamp body 1 at the first side 41 and the reservoir 3 at the second side 42. In this example, the channels 5 extend from the first side 41 to the second side 42.

Figure 2:
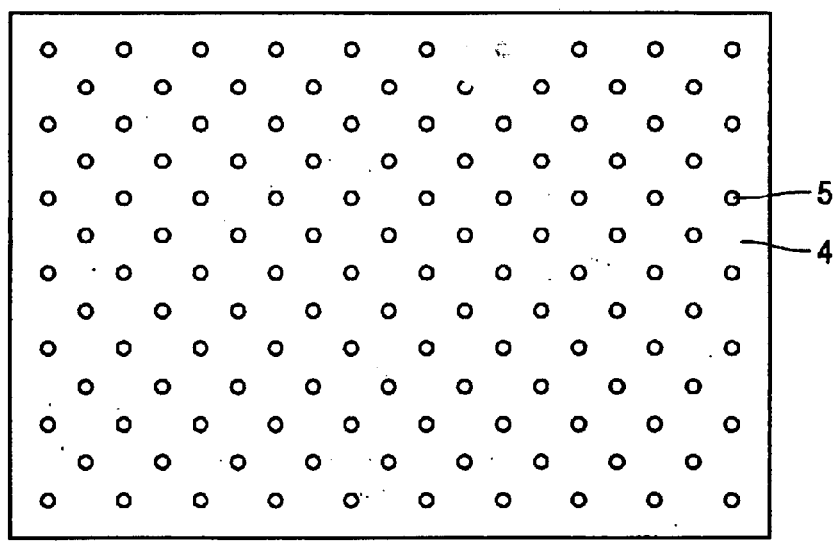
FIG. 2 is a diagrammatic cross-sectional view of the first embodiment taken on the line I—I in FIG. 1.

FIG. 2 is a cross-sectional view of the first embodiment taken on the line I—I in FIG. 1. As is apparent from this Figure, the carrier body 4 is perforated and comprises a large number of channels 5. The channels 5 at the first side 41 each have a diameter smaller than the distance 13 between the first side 11 and the second side 12 of the stamp body. This distance 13—i.e. the thickness of the stamp body 1—is preferably between 100 microns and 1 mm. The carrier body 4 is preferably perforated by means of powder blasting, such that the diameter of the channels is of the order of 20 to 100 microns.

Figure 3:
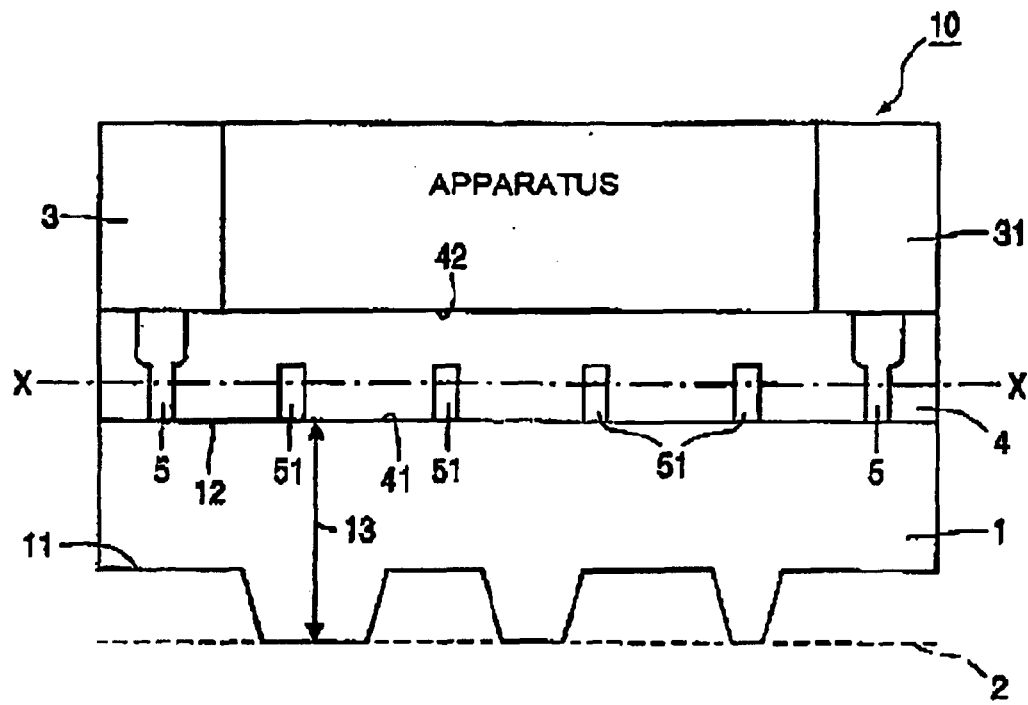
FIG. 3 is a diagrammatic side elevation of a second embodiment of the stamp.

FIG. 3 is a side elevation of a second embodiment of the stamp 10 with a construction comparable to that of the stamp shown in FIG. 1. A difference, however, is that only a portion of the channels 5, 51, i.e. the channels 5, extend from the first side 41 through to the second side 42 of the carrier body. The carrier body 4 is made of metal which was anisotropically etched from the first side 41 and isotropically from the second side 42. The stamp comprises not only a first reservoir 3, but also a second reservoir 31. The two reservoirs 3, 31 are interconnected by the channels 5, 51 and are included in a circuit which further comprises a storage container, a pump, and connection lines. Pumping round of the liquid through this circuit causes the concentration of the ink in the channels 51, at the, second side 12 of the stamp body, to remain substantially constant.

Figure 4:
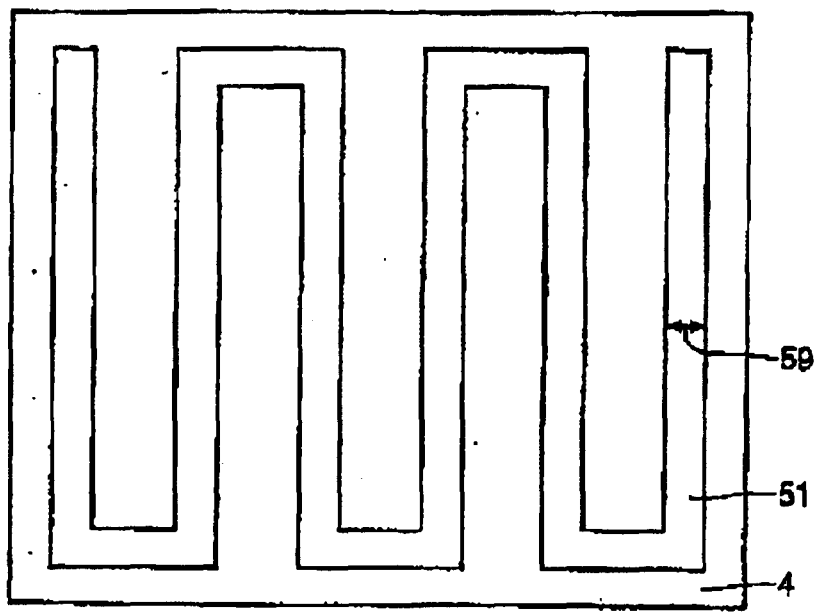
FIG. 4 is a diagrammatic cross-sectional view of the second embodiment taken on the line X—X in FIG. 3.

FIG. 4 is a cross-sectional view of the second embodiment taken on the line X—X in FIG. 3. As FIG. 4 shows, the remaining channels 51 form a conduit. The diameter 59 of these channels 51 is smaller than the distance between the first side 11 and the second side 12 of the stamp body. The conduit formed by the channels 51 connects a first reservoir 3 to a second reservoir 31.

Figure 5:
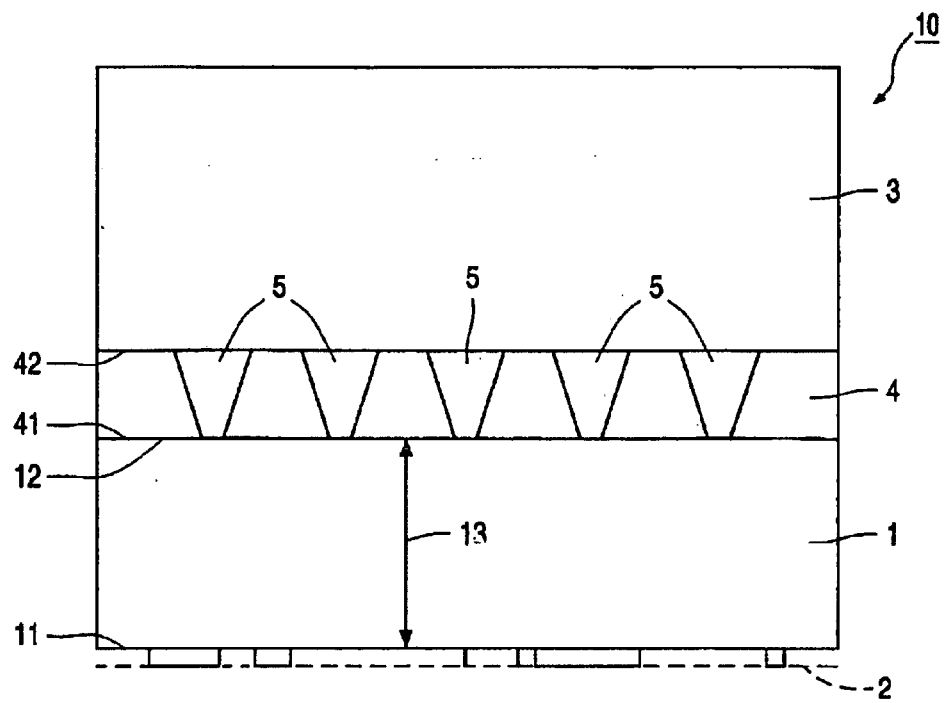
FIG. 5 is a diagrammatic side elevation of a third embodiment of the stamp.

FIG. 5 is a side elevation of a third embodiment of the stamp 10 which has a construction comparable to that of the stamp shown in FIG. 1. A difference, however, is that the channels 5 extending from the first side 41 to the second side 42 of the carrier body 4 are not of the same width everywhere. The channels 5 are conical in shape and have their smallest diameter at the first side 41 of the carrier body 4. The supply of ink to the printing face 2 can be adjusted to a desired supply rate through a suitable choice of this diameter.

Figure 6:
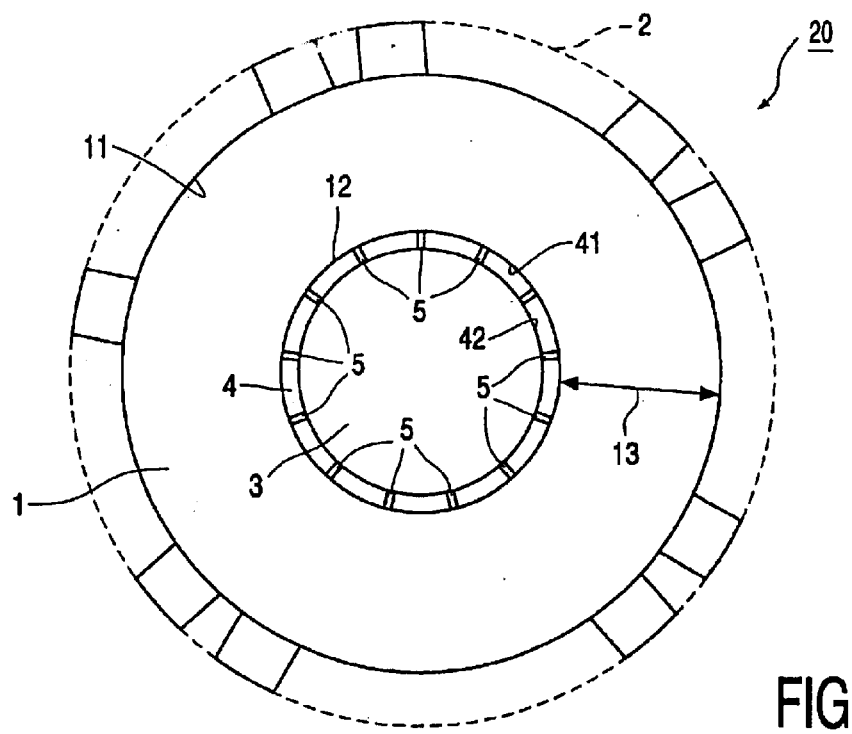
FIG. 6 is a diagrammatic cross-sectional view of a fourth embodiment of the stamp.

FIG. 6 is a cross-sectional view of the stamp 20, which stamp is cylindrical with the printing face 2 forming the outermost cylinder shell. The reservoir 3 is here made of a porous material so that no substantial displacement of ink in the reservoir 3 takes place upon rotation of the stamp 20. Furthermore, the stamp 20 comprises fastening means (not shown). A fastening means may be formed by a magnet in conjunction with a magnet of opposed polarity in the apparatus in which the stamp 20 is fastened. Alternatively, the fastening means may be formed by a mechanical construction, such that the stamp is suspended in the apparatus and is rotatable about its axis.

Embodiment

The desired pattern of the structured printing face 2 was implemented in a master in that a photoresist structure was cured in conventional lithography. The height of the structures was 2.7 $\mu$m. The master was modified with octadecyltrichlorosilane in the gas phase (at a pressure of 0.5 mbar). The stamp body 1 provided with the structured printing face 2 was manufactured through curing of a commercial two-component system, known as Sylgard 184 (supplied by Dow Corning), in contact with the master. The ratio of the two components was 10:1. Curing comprised a first step of 4 hours at 65° C. and a second step of 20 hours at 50° C. The stamp body 1 was given a uniform thickness 13 of 1.7 mm through casting into a Perspex mold. The stamp body 1 was provided with its second side 12 on a filter holder of borosilicate glass. The filter served as the carrier body 4, the filter holder as the reservoir 3. This completed the stamp 10 as shown in FIG. 1.

Previous to the use of the stamp 10, the reservoir 3 was filled with a 2 mM solution of octadecyl thiole in ethanol. A waiting time of 66 hours was then observed so as to allow the solution to diffuse through the stamp 1. Then the printing face 2 was brought into contact for 10 to 15 seconds with a 20 nm thick gold layer which was vapor-deposited on a Corning 7059 borosilicate glass coated with a 2.5 nm thick titanium layer. A slight pressure was exerted on the rear side of the stamp 10 by means of a roller. The gold pattern was developed through etching at room temperature in a freshly made bath of an aqueous solution of 1 M KOH, 0.1 M $K_2S_2O_3$, 0.01 M $K_3Fe(CN)_6$, and 0.001 M $K_4Fe(CN)_6$ for 8 minutes. After this, good prints in Au were obtained on a surface area of almost 10 $cm^2$. The smallest structures from the master, having dimensions of 3 $\mu$m, were correctly transferred in Au.

What is claimed is:

1. A stamp for use in a lithographic process, said stamp comprising:
    a permeable stamp body with a first side and a second side, said first and second sides being opposed;
    a structured printing face at said first side;
    a reservoir for a liquid at said second side; and
    a permeable carrier body with a higher rigidity constant than the permeable stamp body connecting said permeable stamp body and said reservoir,
    wherein said liquid is directly transported from said reservoir through said permeable carrier body and said permeable stamp body to said structured printing face during use.

2. The stamp of claim 1, wherein said permeable carrier body has a first side and a second, opposed side, with said permeable stamp body at said first side and said reservoir at said second side, said permeable carrier body having channels, at least a portion of which extend from said first side to said second side of said permeable carrier body.

3. The stamp of claim 2, wherein said first side and said second side of said permeable stamp body lie at a distance from one another, and said channels at said first side of said permeable carrier body each have a diameter which is smaller than said distance between said first side and said second side of said permeable stamp body.

4. The stamp of claim 1, wherein said permeable carrier body has a porous material.

5. The stamp of claim 1, wherein said reservoir has a porous material.

6. The stamp of claim 1, wherein said stamp is cylindrical in shape, with said structured printing face forming an outer cylinder shell.

7. A method of manufacturing an electronic component, comprising the steps of:
    patterning a surface of a substrate by means of a stamp, said stamp having a structured printed face for use in a lithographic process; and
    bringing said stamp into contact with said substrate such that a liquid cooperative with said structured printing face is transferred to a surface of said substrate,
    wherein said stamp of claim 1 is used therein.

8. The method of claim 7, wherein
    said stamp is cylindrical in shape, and
    said stamp is rotated when being applied to the substrate such that the entire printing face of the stamp is rolled over the substrate.

9. An apparatus for providing at least one patterned layer on a substrate, which apparatus is provided with a stamp of claim 1.

* * * * *